United States Patent [19]
Davey

[11] Patent Number: 4,888,626
[45] Date of Patent: Dec. 19, 1989

[54] SELF-ALIGNED GAAS FET WITH LOW 1/F NOISE

[75] Inventor: John E. Davey, Alexandria, Va.

[73] Assignee: The United States of America as represented by the Secretary of the Navy, Washington, D.C.

[21] Appl. No.: 39,829

[22] Filed: Apr. 17, 1987

Related U.S. Application Data

[63] Continuation of Ser. No. 709,476, Mar. 7, 1985, abandoned.

[51] Int. Cl.⁴ .......................................... H01L 29/80
[52] U.S. Cl. ..................................... 357/22; 357/15; 357/16; 357/55; 357/58
[58] Field of Search ....................... 357/22, 16, 15, 55, 357/58

[56] References Cited

U.S. PATENT DOCUMENTS

| | | |
|---|---|---|
| 3,851,379 | 12/1974 | Gutknecht et al. |
| 4,182,023 | 1/1980 | Cohen et al. |
| 4,305,760 | 12/1981 | Trudel. |
| 4,322,738 | 3/1982 | Bell et al. |
| 4,419,811 | 12/1983 | Rice. |
| 4,419,813 | 12/1983 | Iwai. |
| 4,429,452 | 2/1984 | Meignant. |
| 4,536,942 | 8/1985 | Chao et al. ........................ 357/22 K |

FOREIGN PATENT DOCUMENTS

| | | | |
|---|---|---|---|
| 22383 | 1/1981 | European Pat. Off. ........... 357/22 S |
| 64370 | 11/1982 | European Pat. Off. ........ 357/22 MD |
| 52-72185 | 6/1977 | Japan ........................... 357/22 MD |
| 56-76577 | 6/1981 | Japan ........................... 357/22 MD |
| 57-112079 | 7/1982 | Japan ........................... 357/22 MD |
| 59-4176 | 1/1984 | Japan ................................. 357/22 S |

Primary Examiner—Joseph E. Clawson, Jr.
Attorney, Agent, or Firm—Thomas E. McDonnell; A. David Spevack; Peter T. Rutkowski

[57] ABSTRACT

A self-aligned GaAs FET with an active channel which is unaffected by surface charge trapping/emission. The device comprises a channel of n-doped GaAs, a source and drain regions of n+ GaAs disposed at opposite ends of the channel, a semi-insulating GaAs layer disposed over the channel, with this GaAs layer having open first and second end surfaces disposed at an angle of greater than or equal to 45° relative to the channel plane. A cavity is disposed in the GaAs layer exposing a portion of the channel, and a gate metallization is disposed over the GaAs layer and extending from the first end surface to the second end surface of the GaAs layer and directly contacting the exposed portion of the channel region in the cavity to form a Schottky barrier contact. This gate metallization is not disposed in contact with a significant portion of either of the first and second end surfaces. The ends of the gate metallization overhang slightly the end surfaces of the GaAs layer in order to provide masking to maintain the first and second end surfaces open during fabrication. An insulator such as air may be disposed in contact with these end surfaces.

6 Claims, 2 Drawing Sheets

SELF-ALIGNED GAAS FET WITH LOW 1/F NOISE

This is a continuation of application Ser. No. 709,476, filed on Mar. 7, 1985, now abandoned.

BACKGROUND OF THE INVENTION

The present invention relates generally to GaAs FET devices, and more particularly to self-aligned GaAs FET devices which are unaffected by surface charge trapping/emission effects and thus are unaffected by 1/f noise sources.

In fabricating field effect transistors (FET), either GaAs or silicon is utilized as the semi-conductor material. However, GaAs is the preferred semi-conductor material because its n-channel mobility is 3-5 times faster than in silicon. Additionally, optical devices are made only in GaAs and not silicon. Accordingly, if it is desired to combine electrical and optical devices in an integrated circuit, then GaAs semi-conductor material is required.

One of the preferred fabricating techniques for FET's generally is to locate the source and drain directly adjacent to and on either side of the gate electrode. In such a design, the gate electrode may then be used as a mask for self-aligning the source and the drain relative thereto. However, if the source and the gate or the drain and the gate are actually in contact, than there will be an electrical short circuit. This short circuit problem is obviated in silicon FET devices simply by using a metaloxide semi-conductor (MOS) or an MIS structure. In the MOS structure, a layer of oxide is disposed between the gate electrode and the source and the drain regions thereby preventing the short circuit. By then applying a bias voltage to this insulated gate electrode structure, an active channel may be created below the gate in order to facilitate FET operation. However, a Schottky barrier gate cannot be fabricated with MOS or MIS structures due to the insulating layer utilized.

However, for the preferred GaAs semi-conductor material, it is not possible to invert the surface potential thereof because the Fermi level is locked at the surface. This surface Fermi level cannot be moved around with a bias voltage, thus precluding the use of MIS or MOS structures with GaAs. The lack of an ability to use MIS or MOS semiconductor structures with GaAs precludes the use of the gate/oxide self-alignment fabrication technique with GaAs.

A typical GaAs FET structure is shown in FIG. 1. An n-type doped GaAs channel 10 is shown in the figure formed on a semi-insulating GaAs substrate 11. A gate electrode 12 is disposed on a portion of the surface of the channel 10. A source region 14 of highly doped n+ material is formed in the channel 10 on one side of the gate 12, while a drain region 16 of highly doped n+ material is formed in the channel 10 on the other side of the gate 12. In order to prevent a short circuit between the source 14 and the gate 12, an open surface space 18 is disposed therebetween. Likewise, in order to prevent a short circuit between the drain region 16 and the gate 12, an open surface space 20 is disposed therebetween. The use of this type of spacing to prevent short circuits clearly obviates the ability to use the gate electrode 12 as a mask for the self-alignment of the source and the drain regions during fabrication. Please note that the source-to-gate and the gate-to-drain spacings are exagerated in FIG. 1 to demonstrate certain adverse aspects of the standard FET structure.

The GaAs FET structure shown in FIG. 1 operates as an amplifier and/or an oscillator depending on how the device is connected and biased via its external circuitry. The general FET operating principal is that the electron current flow in the channel 10 from the source 14 to the drain 16 is modulated by the bias on the gate electrode 12 which controls the depth of a depletion region 22 formed in the channel 10 directly below the gate 12. For an n-type doped GaAs substrate, the depletion region is formed by applying a negative voltage to the gate electrode 12 to thereby repel electrons out of the depletion region 22 directly below the gate 12. A small change in the bias voltage on the electrode gate 12 changes the depth of the depletion region 22 into the n-type doped GaAs channel 10 and thereby causes a substantial change in the drain current $I_{ds}$. This action is the basis for FET operation.

One of the difficulties caused by the design shown in FIG. 1 is that the surfaces spaces 18 and 20, which are required to prevent the short circuit of the device, are subject to surface charge trapping and emission of electrons. This charge trapping/emission is related to dangling bonds at the surface of the semiconductor. These dangling or unpaired bonds comprise trapping sites for electrons. The unpaired bonds present may be due to TAMM states in the native crystal lattice and due to contaminating atoms on the surface of the semiconductor. Electrons may become trapped in these trapping sites and re-emitted into the active channel, thus forming the basis for a 1/f noise source, as described below. In essence, a volume 26 in the channel 10 below the open space 18 in the GaAs n-doped substrate 10 forms a depletion region directly adjacent to the main depletion region 22 formed below the gate 12. Likewise, the volume 28 in the GaAs n-doped semiconductor substrate 10 directly below the open space 20 forms a third depletion region adjacent the main depletion region 22. The shifting occupation of the trap sites on the surfaces 18 and 20 due to the trapping and emission phenomena act to change the size of the depletion regions 26 and 28 and thereby perturb the electron flow in the active channel region 10. This perturbation caused by the trapping/emission phenomena causes fluctuations in the current in the active region of channel 10 and is thus a major source of noise. Such noise is typically referred to as 1/f noise. Such 1/f noise places specific limits on the operation of GaAs FET devices and limits their use in such applications as voltage controlled frequency).

There are presently no known designs to minimize the above-noted 1/f noise effects except through surface passivation such as through the use of $SiO_2$ $Si_3N_4$, $Al_2O_3$, etc., on the exposed surfaces However, as cited by Pacel and Curtis in the 1983 IEEE MTT-S digest, pages 282-284, such passivation techniques will not obviate 1/f noise sufficently for device usage in applications such as voltage controlled oscillators.

OBJECTS OF THE INVENTION

Accordingly, it is an object of the present invention to form a GaAs FET device with a current flow through the active channel which is unaffected by the surface charge trapping/emission on its surface.

It is a further object of the present invention to fabricate a GaAs FET device which is unaffected by surface sources of 1/f noise.

It is yet a further object of the present invention to move the open surface regions required in GaAs FET devices away from the active channel region in order to prevent modulation of the drain current by parasitic depletion regions attendant to such open surface regions.

It is yet a further object of the present invention to fabricate a GaAs FET semi-conductor device using a gate self-alignment technique.

Other objects, advantages, and novel features of the present invention will become apparent from the detailed description of the invention, which follows the summary.

SUMMARY OF THE INVENTION

Briefly, the above and other objects are realized with the self-aligned GaAs field effect transistor of the present invention. This GaAs FET comprises a channel region of doped GaAs with a first and a second end;

a source region of heavily-doped GaAs disposed at the first end of the channel region;

a drain region of heavily-doped GaAs disposed at the second end of the channel region;

a GaAs layer disposed over the channel region and extending between the first and second ends of the channel region, with the GaAs layer having a first and a second end surface, with the first and second end surfaces of the GaAs layer being sloped at an angle greater than or equal to 45° relative to the channel region;

a cavity in the GaAs layer exposing a portion of the channel region between the first and second ends; and a gate metallization disposed over the GaAs layer and extending from the first end surface of the GaAs layer to the second end surface of the GaAs layer and directly contacting the exposed portion of the channel region in the cavity to form a Schottky barrier contact, with the gate metallization not being disposed in contact with a significant portion of either of the first and second end surfaces.

In a preferred embodiment, the gate metallization has a first end which overhangs the first end surface of the GaAs layer, and a second end which overhangs the second end surface of the GaAs layer, with these ends acting as masks for maintaining the first and second end surfaces of the GaAs layer open during fabrication. In this preferred embodiment, a first insulator may be disposed in contact with the first end surface over the majority of the surface of the first end surface, and a second insulator may be disposed in contact with the second GaAs layer end surface over the majority of the surface of the second end surface. It is preferred that the channel region be n doped, and the source and drained regions be n+ doped GaAs. Also, the GaAs layer may be semi-insulating.

DETAILED DESCRIPTION OF THE PREFERRED EMBODIMENT

The device structure of the present invention and the method for making same are specifically designed to fold the required spacings between the source and the gate and between the gate and the drain up and away from the active gate depletion region to thereby prevent modulation of the current flowing in the active channel. This design is also specially formulated in order to permit the use of self-alignment techniques in the fabrication of the device.

Figure 1:
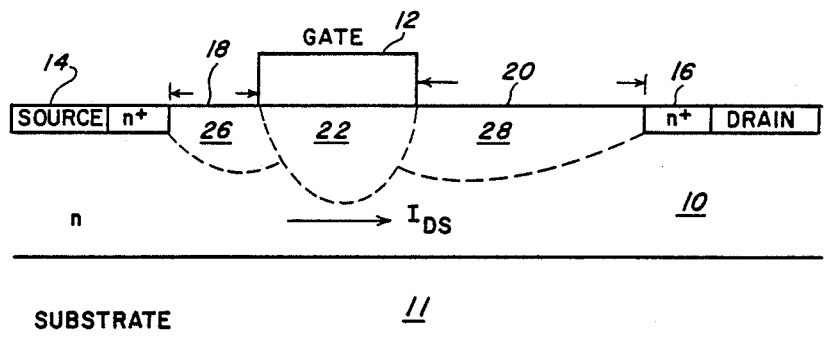
FIG. 1 is a schematic diagram of a typical prior art GaAs FET.
Figure 2:
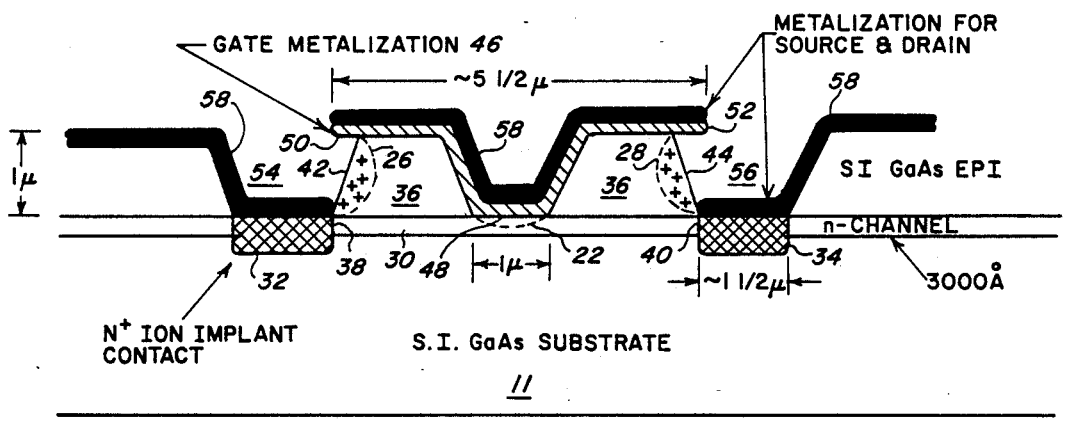
FIG. 2 is a schematic sectioned diagram of one embodiment of the present invention.

Referring now to the drawings, wherein like reference characters designate like or corresponding parts throughout the views, FIG. 2 shows the preferred embodiment of the present invention. The GaAs FET of the invention is formed on a semi-insulating GaAs substrate 11. A channel region 30 of n-type doped GaAs material is formed on the substrate 11. At one end of the channel 30 is a heavily doped source region 32 doped with n+ material Likewise, at the opposite end of the channel 30 is a heavily doped drain region 34 doped with n+ material. A GaAs layer 36 is disposed over the channel 30 and extends between a first end 38 of the channel 30 which is disposed adjacent to the source region 32, and a second end 40 of the channel 30 which is disposed adjacent to the drain region 34. This GaAs layer 36 has a first end surface 42 which is sloped at an angle greater than or equal to 45° relative to the channel 30. Likewise, the GaAs layer 36 has a second end surface 44 sloped at an angle greater than or equal to 45° relative to the channel region 30. A cavity is formed in the GaAs layer 36 to expose a portion 48 of the channel 30 between the first and second channel ends 38 and 40. A gate metallization 46 is disposed over the upper surface of the GaAs layer 36 and extends from the first end surface 42 of the GaAs layer to the second end surface 44 of the GaAs layer and directly contacts the exposed portion 48 of the channel 30 in the cavity to form a Schottky barrier contact in this exposed portion. However, this gate metallization 46 is not disposed in contact with a significant portion of either of the first and second end surfaces 42 and 44.

The gate 46 may have a first end 50 which overhangs the first end surface 42 of the GaAs layer 36. Likewise, the gate 46 may have a second end 52 which overhangs the second end surface 44 of the GaAs layer 36. These overhanging first and second gate ends 50 and 52 act as masks for maintaining the first and second end surfaces 42 and 44 of the GaAs layer 36 open during fabrication to prevent short circuiting between the drain and the gate and between the source and the gate. These overhanging first and second ends 50 and 52 thereby allow the use of self-alignment via gate masking in the fabrication of this device.

Typically, a first insulator 54 will be disposed in contact with the first GaAs layer end surface 42 over the majority of the surface of this first end surface 42. Likewise, a second insulator 56 is disposed in contact with the second GaAs layer end surface 44 over the majority of the surface of the second end surface 44. In a preferred embodiment, these insulators 54 and 56 simply comprise some form of moistureless atmosphere. For example, this device could be hermetically sealed and back-filled with some inert gas. In the alternative, the insulators 54 and 56 could be comprised of some form of polymer or nitride. However, these types of insulators for passivating the device tend to degrade the noise properties and the gain of the device.

A metallization 58 is disposed over the source region 32 and the drain region 34 in order to facilitate electrical contact therewith. Typically, this gate metallization 58 will also be disposed over the gate metallization 46 as part of the fabrication process.

The main depletion region 22, which is modulated by the bias on the gate electrode 46, is represented by the dashed line area 22 in FIG. 2. As noted previously, the end surface 42 of the GaAs layer 36 forms the open region to prevent the short circuiting of the source and the gate. Thus, the parasitic depletion region 26, which is represented by the dashed lined area with the plus signs therein, is formed directly adjacent to this end surface 42 due to the trapping sites on this surface. Likewise, the end surface 44 forms the open surface area which prevents the short circuiting of the drain 34 and the gate 46. Accordingly, the parasitic depletion region 28 is formed directly adjacent to this end surface 44 and is represented by the dash lined area with the plus signs therein.

It can be seen that the present GaAs FET design has folded the open surfaces (the end surfaces 42 and 44) and their respective parasitic depletion regions 26 and 28 up and away from the active gate depletion region 22. Accordingly, the surface charging and discharging effects associated with the exposed end surfaces 42 and 44 are removed from the active gate depletion region 22. Thus, their effects on the current flow in this active region are obviated, thereby reducing the 1/f noise.

Figure 3A:
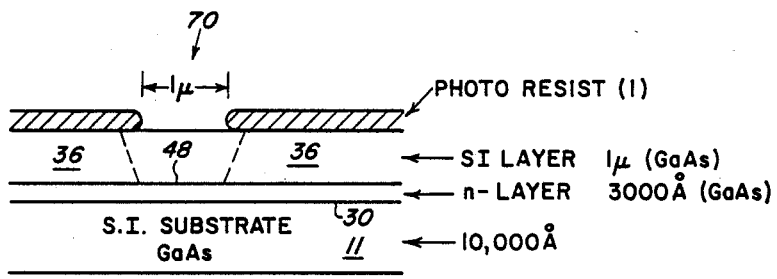
FIG. 3a–3e are schematic sectioned diagrams of various stages in the fabrication of the embodiment of the invention shown in FIG. 2.

The following is a description of the preferred method of fabricating the device shown in FIG. 2. Referring to FIG. 3a, a layer 30 of n-type GaAs (approximately $13 \times 10^{17}/cm^3$ doping) is grown on a piece of semi-insulating (100) bulk GaAs 11. Note that layers 30 and 36 preferably also have a (100) orientation. Typically, this layer 30 will be grown epitaxially on the bulk GaAs substrate 10. However, other methods for applying this n-type GaAs layer 30 may be utilized, including implantation via a high energy beam. In the design shown in the figure, the channel layer 30 is on the order of 3000 angstroms in thickness. This layer 30 comprises the active channel for the device.

Layer 36 of GaAs is then formed on the channel layer 30. If the channel layer 30 is grown epitaxially on the substrate 10, then generally the GaAs layer 36 should also be grown epitaxially on the channel layer 30. However, again this GaAs layer 36 may be implanted via a high energy beam. It is preferred that this GaAs layer 36 be an undoped layer of semi-insulating GaAs in order to better define the channel layer 30. However, it should be noted that this layer 36 can also be n-type doped GaAs. Typically, the thickness of this GaAs layer 36 is on the order of 5000 to 10,000 angstroms, depending on the device geometry desired and the processing requirements. The thickness of the GaAs layer 36 in FIG. 3a is shown to be 10,000 angstroms. It should be noted that the layers 30 and 36 may be grown by MBE, MOCVD, or VPE techniques, but preferably should be performed in a continuous growth process from layer 30 to layer 36.

In order to form the cavity for the gate of the device, a photoresist layer PR (1) is applied to the surface of the GaAs layer 36 with an appropriate opening 70 masked therein to provide an approximate 1 μm long exposed surface 48 of the channel layer 30 after etching. A preferential etch is utilized to form the appropriate cavity in the GaAs layer 36 in order to provide the 1 μm long exposed gate at the layer 30. This etched opening is represented by the dashed lines below and on either side of the opening 70 in FIG. 3a. A channel stop etch is utilized in order to stop the etching at the channel 30, as is well known in the art. However, a 200–300 angstrom undercut may be employed if desired.

Figure 3B:
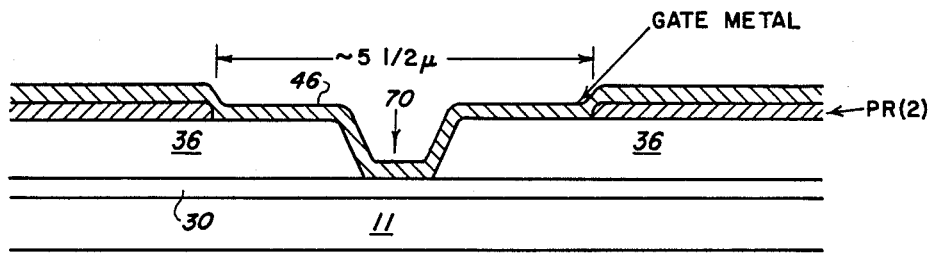

After the etching step and the removal of the photoresist layer PR (1), a second photoresist layer PR (2) is applied via proper masking techniques to opposite sides of the cavity opening 70 with an opening which is larger than this etched cavity opening 70. This second photoresist layer PR(2) is shown in FIG. 3b. The purpose of this second photoresist layer PR (2) with its large opening therein is to facilitate the deposit of the gate metallization layer 46. In the design of FIG. 2, the opening in the photoresist PR (2) is on the order of 5½ μm in length and is centered about the etched opening 70 for the gate. A gate metallization layer 46 is then deposited in this opening as shown in FIG. 3b. Preferrably, this gate metal should be a refractory metal. Refractory metals are advantageous because they prevent the interdiffusion between the contact metal (typically gold) and GaAs. Refractory metals are also high temperature metallization systems and thus can be annealed at high temperatures. Examples of refractory metals that may be utilized are TiPtAu, TiWAu, and TiTaAu.

Figure 3C:
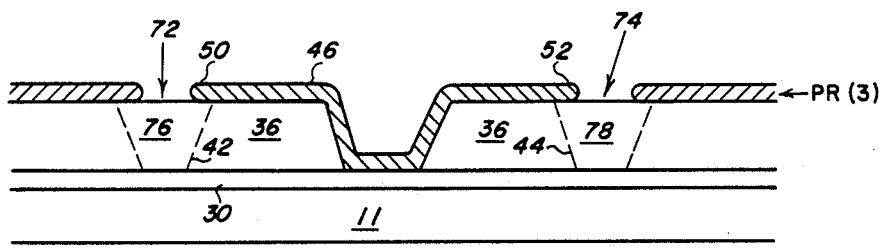

The excess refractory gate metal layer disposed over the photoresist layer PR (2) is then removed with a suitable solvent which also removes this second photoresist layer PR (2). Then a third photoresist layer PR (3) is applied to the surface of the GaAs layer 36, as shown in FIG. 3c. This third photoresist layer PR (3) is applied with proper masking in order to provide 1½ μm openings 72 and 74 adjacent ends 50 and 52 of the gate metallization. Then, a preferential etch is applied using the photoresist layer PR (3) and the gate ends 50 and 52 for masking, as shown in FIG. 3c. The etched cavities 76 and 78 are formed below the opening 72 and 74, respectively, and are represented by the dashed lines in the figure. These openings 76 and 78 extend down to the channel 30. The angled end surfaces, 42 for the opening 76 and 44 for the opening 78, have angles with respect to the plane of the channel 30 which are determined by the etch rate of the etchant used. These angles are equal to or greater than 45° with respect to the channel 30, and typically are less than 90°.

Figure 3D:
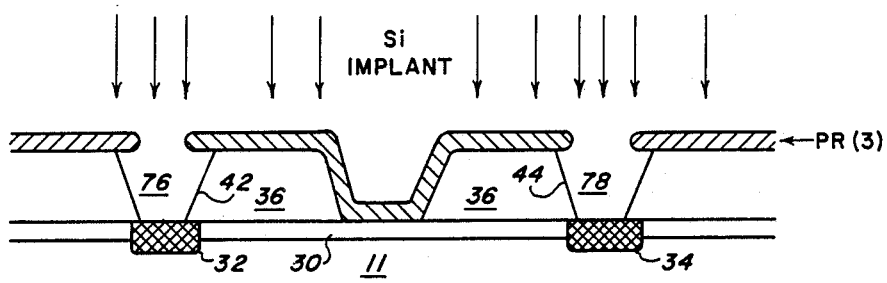

Referring to FIG. 3d, an n+ implant is then applied to the bottom of the cavities 76 and 78 to form the n+ source region 32 and the n+ drain region 34, respectively. By way of example, this n+ implant may be a silicon implant at $10^{14}/cm^2$ using a 30 keV ion beam. Typically, these implanted n+ regions 32 and 34 extend 3000–5000 angstroms into the channel 30. Again, note that the photoresist layer PR (3) and the gate ends 50 and 52 act as a mask for this n+ implanting operation.

The third photoresist layer PR (3) is then removed with a suitable solvent. Then the n+ implanted regions 32 and 34 are activated by annealing the device at a temperature between 750–850° for approximately 15 minutes in an As overpressure in order to activate the implanted species so that the species ions go into substitution positions.

Figure 3E:
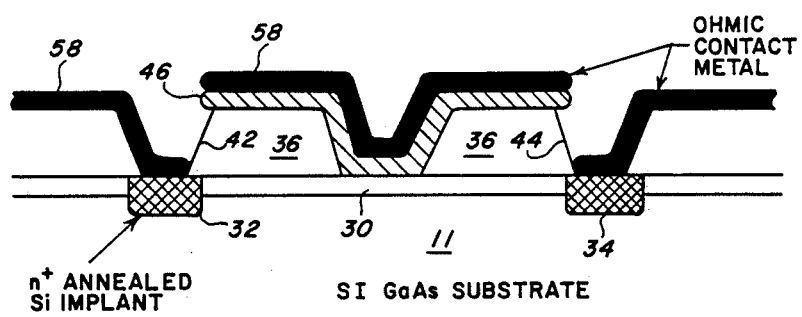

Next he source and drain metal contacts 58 are applied onto the source and drain openings 76 and 78. By way of example, these source and drain metal contacts 58 may be of AuGeNi or a refractory equivalent. These contacts may be evaporated onto the source and drain openings 76 and 78. Again, the gate ends 50 and 52 which overhand the cavities 76 and 78, respectively, serve as a mask and align this evaporation onto the source and drain while maintaining the end surfaces 42 and 44 of the GaAs layer 36 open. Note that for ease of fabrication, the ohmic contact layer 58 is also disposed over the gate metallization layer 46. These contacts may be deposited onto a substrate heated to a temperature in the range 300–400° C. The completed structure is shown in FIG. 3e. As noted previously, this device may be hermetically sealed and then back-filled with some form of inert gas.

Again, it is reiterated that the present design acts to fold the open end surfaces 42 and 44, which are required to prevent the short circuiting between the gate and the source and the gate and the drain, respectively, up and away from the active gate depletion region 22, which is disposed directly under the gate. Thus, any surface charging or discharging effects associated with the exposed end surfaces 42 and 44 are physically removed from the gate region and their effects on the current flow and the 1/f noise in the active channel are obviated.

It should be noted that the figures are not drawn to scale so that the relative dimensions for the various elements shown in the figures are not accurate. This was done for ease of explanation of the invention.

It should also be noted that the present design was discussed in the context of n and n+ doping of the GaAs material. It should be noted that this device could also utilize p-type doping of the GaAs layers. However, the carrier mobility in p-type doped GaAs layers is significantly less than the mobility for electrons in n-doped GaAs.

In essence, the present design and processing of the active layer removes, electrically and physically, the exposed source-gate and gate-drain region from affecting the active channel region. Thus, the 1/f noise due to surface trapping/emission effects is minimized. Additionally, this design permits the use of self-alignment fabrication techniques.

Obviously many modifications and variations of the present invention are possible in light of the above teachings. It is therefore to be understood that within the scope of the appended claims, the invention may be practiced otherwise than as specifically described.

What is claimed and desired to be secured by Letters Patent of the United States is:

1. A self-aligned GaAs effect transistor with an active channel which is unaffected by surface charge trapping/emission, comprising:
    a channel region of doped GaAs with a first and a second end;
    a source region of heavily doped GaAs disposed at said first end of said channel region:
    a drain region of heavily doped GaAs disposed at said second end of said channel region:
    an epitaxial semi-insulating GaAs layer disposed over said channel region and extending between said first and second ends of said channel region where said source and drain regions are disposed, said semi-insulating GaAs layer having first and second end surfaces near said first and second ends of said channel region, said source and drain regions being uncovered by said semi-insulating GaAs layer, said first and second end surfaces of said semi-insulating GaAs layer being sloped at an angle greater than or equal to 45 degrees relative to said channel region;
    a cavity in said semi-insulating GaAs layer exposing a portion of said channel region between said first and second ends of said channel region; and
    a gate metallization disposed over said semi-insulating GaAs layer and extending over said semi-insulating GaAs layer and said cavity from said first end surface of said semi-insulating GaAs layer to said second end surface of said semi-insulating GaAs layer and directly contacting said exposed portion of said channel region in said cavity to form a Schottky barrier contact with said portion of said channel region, said gate metallization has a first end thereof which juts sideward and overhangs said sloped first end surface of said semi-insulating GaAs layer and a second end thereof which juts sideward and overhangs said sloped second end surface of said semi-insulating GaAs layer, said overhanging first and second gate metallization ends acting as masks for maintaining said sloped first and second end surfaces of said semi-insulating GaAs layer open during fabrication and for self-aligning the source and drain regions to a gate region by gate masking.

2. A self-aligned GaAs field effect transistor as defined in claim 1, comprising:
    an insulator layer disposed on the majority of the surface of said first semi-insulating GaAs layer end surface; and
    an insulator layer disposed on the majority of the surface of said second semi-insulating GaAs layer end surface.

3. A self-aligned GaAs field effect transistor as defined in claim 2, wherein said cavity in said semi-insulating GaAs layer is disposed at approximately the midpoint of said channel region beneath said semi-insulating GaAs layer.

4. A self-aligned GaAs field effect transistor with an active channel which is unaffected by surface charge trapping/emission, comprising:
    a channel region of n-doped GaAs disposed on a substrate of semi-insulating GaAs;
    a layer of semi-insulating GaAs disposed over said channel region;
    a first opening in said semi-insulating GaAs layer exposing a portion of said n-type GaAs channel region;
    a gate metal disposed on said semi-insulating GaAs layer over an area centered about said first opening in said semi-insulating GaAs layer but larger than said first opening so that the gate metal covers the exposed portion of said GaAs channel to form a Schottky barrier contact and extends up out of said first opening to cover a portion of said semi-insulating GaAs layer on all sides of said first opening, said gate metal terminating on said semi-insulating GaAs layer at oppositely disposed first and second ends of said gate metal;
    second and third openings in said semi-insulating GaAs layer extending down to said n-type GaAs channel regions on opposite sides of said first opening in said semi-insulating GaAs layer, said second and third openings being adjacent said first and second gate metal ends, with said first and second gate metal ends partially overhanging said second and third openings, with a side of said second opening below said first end of said gate metal forming a first semi-insulating GaAs layer end surface, and with a side of said third opening below said second end of said gate metal forming a second semi-insulating GaAs layer end surface;

an n+ doped source region disposed in the portion of said n-type GaAs channel exposed by said second opening;

an n+ doped drain region disposed in the portion of said n-type GaAs channel exposed by said third opening; and said gate metal ends act as masks for maintaining said first and second semi-insulating GaAs layer end surfaces open during fabrication and for self-aligning the source and drain regions to a gate region by using the gate metal as a mask for ion implantation of the source and drain regions;

metal contacts disposed on said source and drain regions through said second and third openings;

an insulator layer disposed in contact with said first GaAs layer end surface; and an insulator layer disposed in contact with said second GaAs layer end surface.

5. A GaAs field effect transistor with an active channel which is unaffected by surface charge trapping/emission, comprising;

a channel region of doped GaAs with first and second ends;

a source region of heavily doped GaAs disposed at said first end of said channel region;

a drain region of heavily doped GaAs disposed at said second end of said channel region;

an epitaxial semi-insulating GaAs layer disposed over said channel region and extending between said first and second ends of said channel region where said source and drain regions are disposed, said semi-insulating GaAs layer having first and second end surfaces near said first and second ends of said channel region, said source and drain regions being uncovered by said semi-insulating GaAs layer;

a cavity in said semi-insulating GaAs layer exposing a portion of said channel region between said first and second ends of said channel region, said cavity being disposed at approximately the mid-point of said channel region; and a gate metallization disposed over said semi-insulating GaAs layer and extending over said semi-insulating GaAs layer and said cavity from said first and second end surfaces of said semi-insulating GaAs layer and directly contacting said exposed portion of said channel region in said cavity to form a Schottky barrier contact with said portion of said channel region;

said gate metallization having a first end thereof which juts sideward and overhangs said first end surface of said semi-insulating GaAs layer and a second end thereof which juts sideward and overhangs said second end surface of said semi-insulating GaAs layer said first and second gate metal ends act as masks for maintaining said first and second semi-insulating GaAs layer end surfaces open during fabrication and for self-aligning the source and drain regions to a gate region by using the gate metallization as a mask for ion implantation of the source and drain regions;

an insulator in the form of an inert gas in contact with the majority of the surface of said first semi-insulating GaAs layer end surface; and an insulator in the form of an inert gas in contact with the majority of the surface of said second semi-insulating GaAs layer end surface.

6. A self-aligned GaAs field effect transistor with an active channel which is unaffected by surface charge trapping/emission, comprising:

a channel region of doped GaAs with first and second ends;

a source region of heavily doped GaAs disposed at said first end of said channel region;

a drain region of heavily doped GaAs disposed at said second end of said channel region;

an epitaxial semi-insulating GaAs layer disposed over said channel region and extending between said first and second ends of said channel region where said source and drain regions are disposed, said semi-insulating GaAs layer having first and second end surfaces near said first and second ends of said channel region, said source and drain regions being uncovered by said semi-insulating GaAs layer;

said first and second end surfaces of said semi-insulating GaAs layer being sloped at an angle greater than or equal to 45 degrees relative to said channel region;

a cavity in said semi-insulating GaAs layer exposing a portion of said channel region between said first and second ends of said channel region, said cavity being disposed at approximately the mid-point of said channel region; and a gate metallization disposed over said semi-insulating GaAs layer and extending over said semi-insulating GaAs layer and said cavity from said first end surface of said semi-insulating GaAs layer to said second end surface of said semi-insulating GaAs layer and directly contacting said exposed portion of said channel region in said cavity to form a Schottky barrier contact with said portion of said channel region;

said gate metallization having a first end thereof which juts sideward and overhangs said sloped first end surface of said semi-insulating GaAs layer and a second end thereof which juts sideward and overhangs said sloped second end surface of said semi-insulating GaAs layer, said overhanging first and second gate metallization ends acting as a mask for maintaining said sloped first and second end surfaces of said semi-insulating GaAs layer open during fabrication and for self-aligning said source and drain regions to the gate by using the gate metallization as a mask for ion-implantation of said source and drain regions;

an insulator layer disposed on the majority of the surface of said first semi-insulating GaAs layer end surface; and an insulator layer disposed on the majority of the surface of said second semi-insulating GaAs layer end surface.

* * * * *